(12) United States Patent
Rissing

(10) Patent No.: US 7,157,903 B2
(45) Date of Patent: Jan. 2, 2007

(54) INDUCTIVE SENSOR AND ROTARY ENCODER PROVIDED WITH AN INDUCTIVE SENSOR

(75) Inventor: Lutz Rissing, Seebruck (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 126 days.

(21) Appl. No.: 10/783,303

(22) Filed: Feb. 20, 2004

(65) Prior Publication Data

US 2004/0164728 A1 Aug. 26, 2004

(30) Foreign Application Priority Data

Feb. 21, 2003 (DE) ................. 103 07 674

(51) Int. Cl.
*G01B 7/30* (2006.01)
*H01F 5/04* (2006.01)

(52) U.S. Cl. ............................. 324/207.17; 324/207.25

(58) Field of Classification Search ......... 324/207.15, 324/207.16, 207.17, 207.24, 207.25, 258, 324/260, 262, 249, 207.21, 252, 207.26; 336/122, 123, 232; 361/735; 257/427

See application file for complete search history.

(56) References Cited

U.S. PATENT DOCUMENTS

| | | | | |
|---|---|---|---|---|
| 5,150,115 A | * | 9/1992 | deJong et al. | 340/870.31 |
| 5,740,527 A | | 4/1998 | Mitama | |
| 5,947,691 A | * | 9/1999 | Brown et al. | 417/44.1 |
| 6,070,337 A | * | 6/2000 | Wallrafen | 33/708 |
| 6,152,353 A | * | 11/2000 | Sani-Bakhtiari et al. | 228/180.1 |
| 6,313,624 B1 | * | 11/2001 | Alhorn et al. | 324/207.17 |
| 6,522,129 B1 | | 2/2003 | Miyata et al. | |
| 6,597,062 B1 | * | 7/2003 | Li et al. | 257/686 |
| 6,605,939 B1 | * | 8/2003 | Jansseune et al. | 324/207.16 |
| 6,734,665 B1 | * | 5/2004 | Jagiella et al. | 324/207.16 |
| 6,828,783 B1 | * | 12/2004 | Schroter et al. | 324/207.25 |
| 6,943,543 B1 | * | 9/2005 | Gass et al. | 324/207.17 |
| 6,969,906 B1 | * | 11/2005 | Choi | 257/685 |
| 2001/0048313 A1 | * | 12/2001 | Frank | 324/663 |
| 2001/0053068 A1 | | 12/2001 | Murayama et al. | |
| 2002/0011839 A1 | | 1/2002 | Miyata et al. | |
| 2003/0057544 A1 | * | 3/2003 | Nathan et al. | 257/700 |
| 2003/0218458 A1 | * | 11/2003 | Seger et al. | 324/303 |
| 2004/0095151 A1 | * | 5/2004 | Schmidt et al. | 324/686 |

FOREIGN PATENT DOCUMENTS

DE 101 11 966 1/2002

* cited by examiner

*Primary Examiner*—Edward Lefkowitz
*Assistant Examiner*—Kenneth J. Whittington
(74) *Attorney, Agent, or Firm*—Kenyon & Kenyon LLP

(57) ABSTRACT

An inductive sensor includes at least two circuit boards and receiver circuit traces applied on the first circuit board. Arranged on the second circuit board are components of an evaluation electronics for evaluating signals that originate from the receiver circuit traces. The two circuit boards are joined in a sandwich-type manner and at least one component of the evaluation electronics is accommodated between the two circuit boards. A rotary encoder may be fitted with this inductive sensor.

12 Claims, 3 Drawing Sheets

INDUCTIVE SENSOR AND ROTARY ENCODER PROVIDED WITH AN INDUCTIVE SENSOR

CROSS-REFERENCE TO RELATED APPLICATIONS

The present application claims priority to Application No. 103 07 674.3, filed in the Federal Republic of Germany on Feb. 21, 2003, which is expressly incorporated herein in its entirety by reference thereto.

FIELD OF THE INVENTION

The present invention relates to an inductive sensor for determining relative positions, e.g., relative angular positions and to a rotary encoder provided with an inductive sensor.

BACKGROUND INFORMATION

Inductive sensors are used in rotary encoders, for example, to determine the angular position of two machine components that are able to be rotated relative to one another. They are also used in measuring devices to determine the position of two machine components that may be displaced longitudinally relative to one another.

In the case of inductive sensors, excitation coils and receiver coils are often applied onto a shared circuit board in the form of circuit traces, the circuit board being permanently connected to a stator of a rotary encoder, for instance. Situated across from this circuit board is another board onto which electrically conductive areas are applied as a pitch structure at periodic intervals, and which are connected to the rotor of the rotary encoder in a rotatably fixed manner. When an electric excitation field is applied to the excitation coils, signals as a function of the angular position are generated in the receiving coils, the signals being generated during the relative turning of rotor and stator. These signals are then processed further in evaluation electronics. The components of such an evaluation electronics are often accommodated on an additional circuit board. The circuit board having the excitation and receiver coils and the circuit board having the evaluation electronics are quite often interconnected via flex conductors and plug-in connections. This type of electrical connection takes up a relatively large volume. However, this runs counter to the constant call for miniaturization of such sensors or rotary encoders.

German Published Patent Application No. 101 11 966 describes a structure for an inductive sensor in which the excitation and receiver coils and also components of the evaluation electronics are implemented in a multi-layer structure in the form of a laminate. This structure has the disadvantage, however, that it may be relatively sensitive to external influences and may not allow optimum space utilization.

It is an aspect of the present invention to provide an inductive sensor that may stand up to external influences and may require extremely limited installation space. The present invention may also provide a reliable rotary encoder having small outer dimensions.

SUMMARY

The above and other beneficial aspects of the present invention may be achieved by providing an inductive sensor as described herein.

According to an example embodiment of the present invention, the circuit board onto which the receiver circuit traces are applied, and the circuit board on which the evaluation electronics are situated, are joined in a sandwich-type manner, sensitive electronic components of the evaluation electronics being situated between these circuit boards. In this manner, the circuit boards may protect the electronic components from external influences.

In an example embodiment of the present invention, for added protection of the components, the components are accommodated in one or a plurality of recesses of the opposite-lying circuit board, e.g., on the circuit board having the receiver circuit traces.

In an example embodiment of the present invention, at least one of the circuit boards may be provided with a partial or complete circumferential ridge, so that the gap between the circuit boards joined in a sandwich-like manner is at least partially covered or sealed. A ridge may be provided at the outer circumference, i.e., on the cylindrical shell side, of the circuit-board composite construction (made up of the circuit boards joined in a sandwich-type manner).

It may be provided that the cavity between the circuit boards, joined in a sandwich-type manner, in which components of evaluation electronics are accommodated, is filled up using a filler material. This type of construction maybe able to increase the robustness, e.g., the vibration resistance, of the inductive sensor and the rotary encoder provided with such an inductive sensor.

In an example embodiment of the present invention, an inductive sensor includes at least two circuit boards, receiver circuit traces arranged on a first one of the circuit. boards, and components of an evaluation electronic arrangement configured to evaluate signals that originate from the receiver circuit traces arranged on a second one of the circuit boards. The circuit boards may be joined in a sandwich manner, and at least one component of the evaluation electronic arrangement may be arranged between the circuit boards.

The components of the evaluation electronic may be arranged on both sides of the second one of the circuit boards.

The first one of the circuit boards may include a recess configured to accommodate at least one of the components of the evaluation electronic arrangement.

At least one of the circuit boards may include an at least partially circumferential ridge arranged to at least partially cover a gap between the circuit boards joined in the sandwich manner. The ridge may be arranged on a cylindrical shell side of the at least one of the circuit boards.

The first one of the circuit boards and the second one of the circuit boards may be joined to each other at least one of mechanically and electrically by a soldered connection.

The first one of the circuit boards and the second one of the circuit boards may be joined to each other by a bonded connection.

The first one of the circuit boards and the second one of the circuit boards may be joined to each other by a welded connection.

The inductive sensor may include a filler material arranged to fill a volume between the circuit boards.

In an example embodiment of the present invention, an inductive sensor includes at least two circuit boards, a first one of the circuit boards including a recess, receiver traces arranged on the first one of the circuit boards, and components of an evaluation electronic arrangement configured to evaluate signals that originate from the receiver circuit traces arranged on a second one of the circuit boards. The circuit boards may be joined in a sandwich manner, at least one component of the evaluation electronic arrangement may be arranged in the recess of the first one of the circuit boards and between the first one of the circuit boards and the second one of the circuit boards, and the circuit boards may be connected to each other at least one of electrically and mechanically by a solder connection.

In an example embodiment of the present invention, a rotary encoder includes an inductive sensor, and the inductive sensor includes at least two circuit boards, receiver circuit traces arranged on a first one of the circuit boards, and components of an evaluation electronic arrangement configured to evaluate signals that originate from the receiver circuit traces arranged on a second one of the circuit boards. The circuit boards may be joined in a sandwich manner, and at least one component of the evaluation electronic arrangement may be arranged between the circuit boards.

Further details and aspects of the inductive sensor according to the present invention and the rotary encoder provided therewith are derived from the following description of example embodiments, on the basis of the appended Figures.

DETAILED DESCRIPTION

Figure 1:
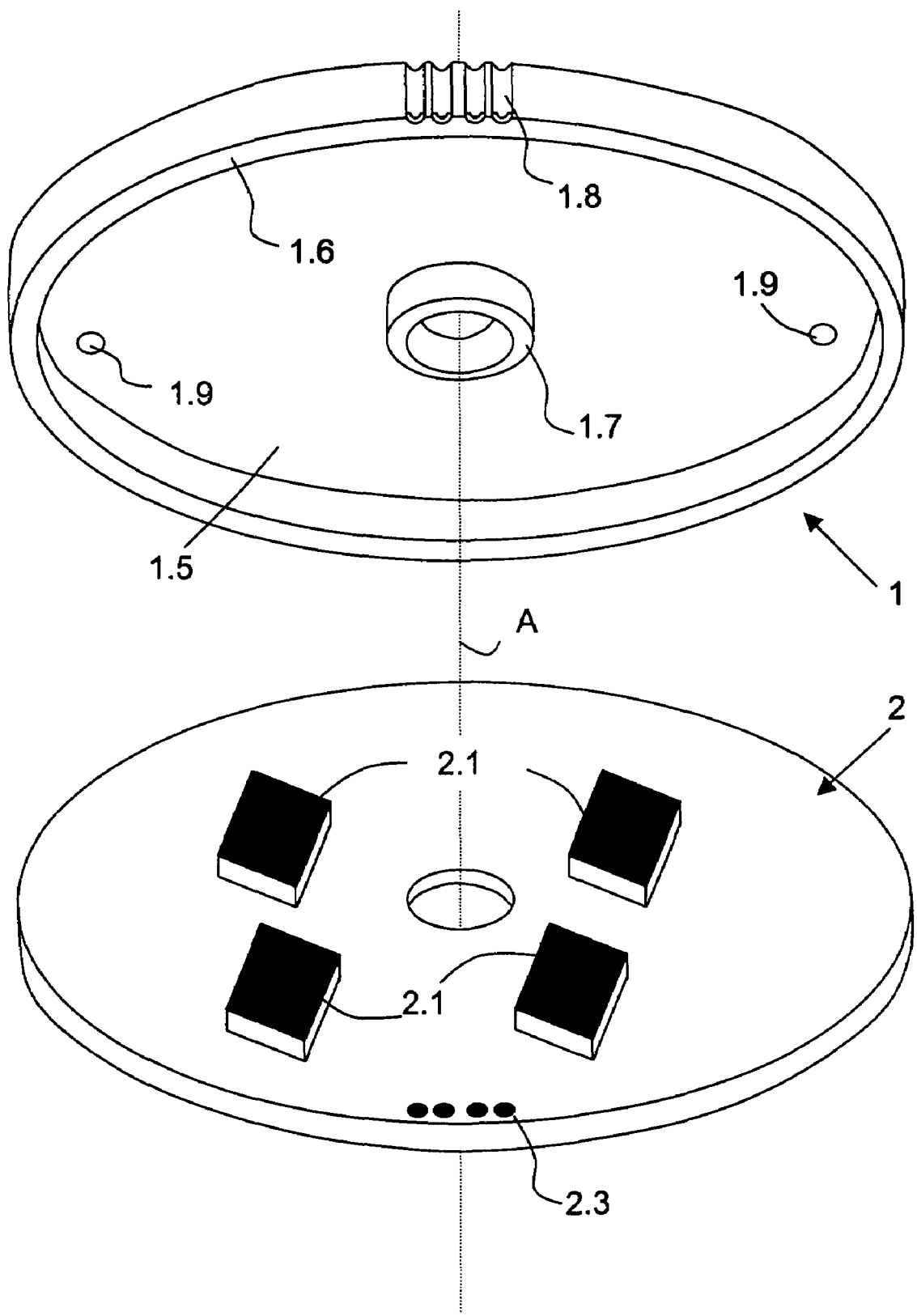
FIG. 1 is a perspective view of the two circuit boards prior to being joined.

In FIG. 1, a section of an inductive sensor is shown in a perspective view prior to being joined. The sensor is made up, among others, of an annular first circuit board 1 on the basis of a rigid, fiber-glass reinforced epoxy resin, which is provided with receiver circuit traces 1.1 and excitation circuit traces 1.2 (cf. FIG. 2). First circuit board 1 has an annular recess 1.5 that was milled out of the circuit-board material, so that two circumferential ridges 1.6 and 1.7 are provided to delimit recess 1.5. Both for establishing an electrical contact between receiver circuit traces 1.1 (and also excitation coils 1.2) and second circuit board 2, and also for mechanically joining first circuit board 1 to second circuit board 2, so-called semi-sleeves 1.8 are arranged on first circuit board 1, which are soldered to soldering pad 2.3 of a second circuit board 2 during assembly of the sensor. Fill openings 1.9 in the form of bore holes in first circuit board 1 are provided for the later filling of joined circuit boards 1, 2.

Second circuit board 2, which has a rigid, fiber-glass reinforced epoxy resin as substrate, is fitted on its two surfaces with electronic components 2.1, 2.2 (cf. FIG. 2) of evaluation electronics. The surface, facing first circuit board 1, of second circuit board 2 has particularly sensitive components 2.1. In the example shown, these are unhoused ASIC's, among others, which were applied to circuit board 1 with the aid of chip-on-board technology. Using unhoused components 2.1 may result in additional space savings because no space for the housings must be taken into account.

Figure 2:
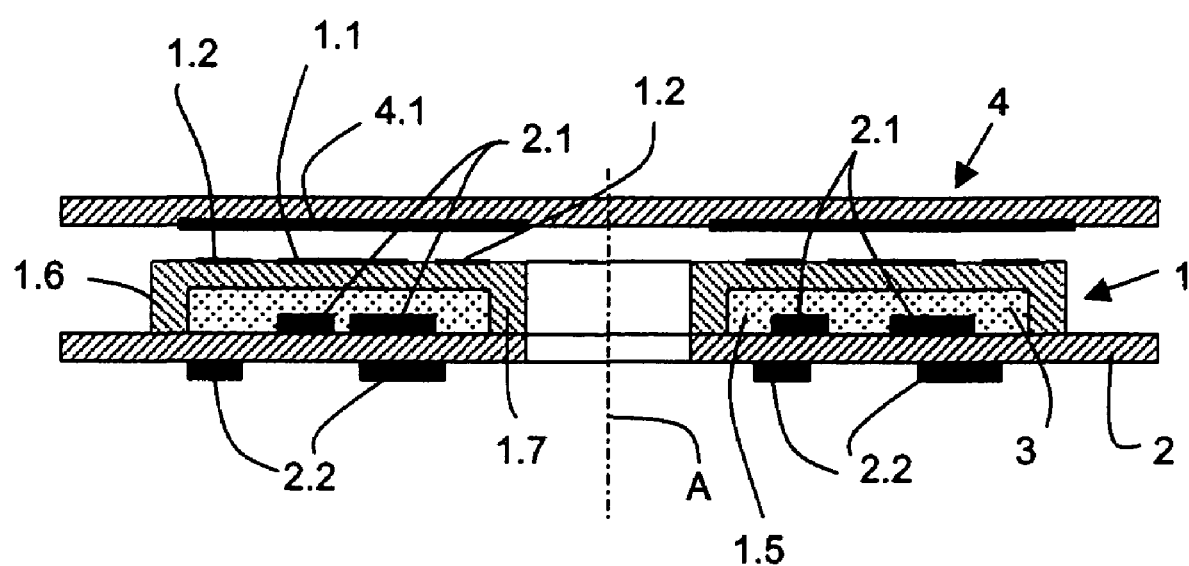
FIG. 2 is a cross-sectional view through the inductive sensor according to an example embodiment of the present invention.

FIG. 2 shows a cross-sectional view of the sensor array, the two circuit boards 1, 2 already assembled in the form of a sandwich, e.g., having a parallel orientation with respect to one another. It may be seen inside that recess 1.5 accommodates the particularly sensitive components 2.1. First circuit board 1 is used as virtual lid to protect the covered electronic components 2.1. The covering extends not only in the axial direction, but in the radial direction as well, since ridges 1.6, 1.7 protect components 2.1 in this direction, too. In this manner, components 2.1 may be effectively shielded from external influences, such as penetrating lubricants or humidity, as well as from mechanical influences. To increase the protection against external influences even further, the volume between first circuit board 1 and second circuit board 2, i.e., the cavity formed by the recess, is filled up with a filler material 3. In doing so, liquid filler material 3 is pressed through one of fill openings 1.9 into recess 1.5, while the displaced air escapes via other fill opening 1.9. After filling, the initially liquid filler material 3 cures to form a solid mass. As an alternative, a gel-type filler material 3, on a silicon basis, for instance, may be used as well. Introduced filler material 3 may increase the vibration resistance of the inductive sensor and thus the robustness of the rotary decoder equipped with this type of sensor.

From FIG. 2 it may be gathered, among others, that both surfaces of second circuit board 2 are available to be fitted with components 2.1, 2.2. This means that, compared to one-surface fitting, a circuit board 2 having a reduced diameter may be used for the given number of components 2.1, 2.2, which may be ultimately decisive for the exterior dimensions of a rotary decoder.

In addition to first circuit board 1 and second circuit board 2, FIG. 2 also shows a board 4 on which a pitch structure is arranged in the form of conductive surfaces 4.1 periodically applied onto board 4. During operation of the sensor, board 4 rotates about axis of rotation A with respect to the sandwich composite construction of the two circuit boards 1, 2.

Figure 3:
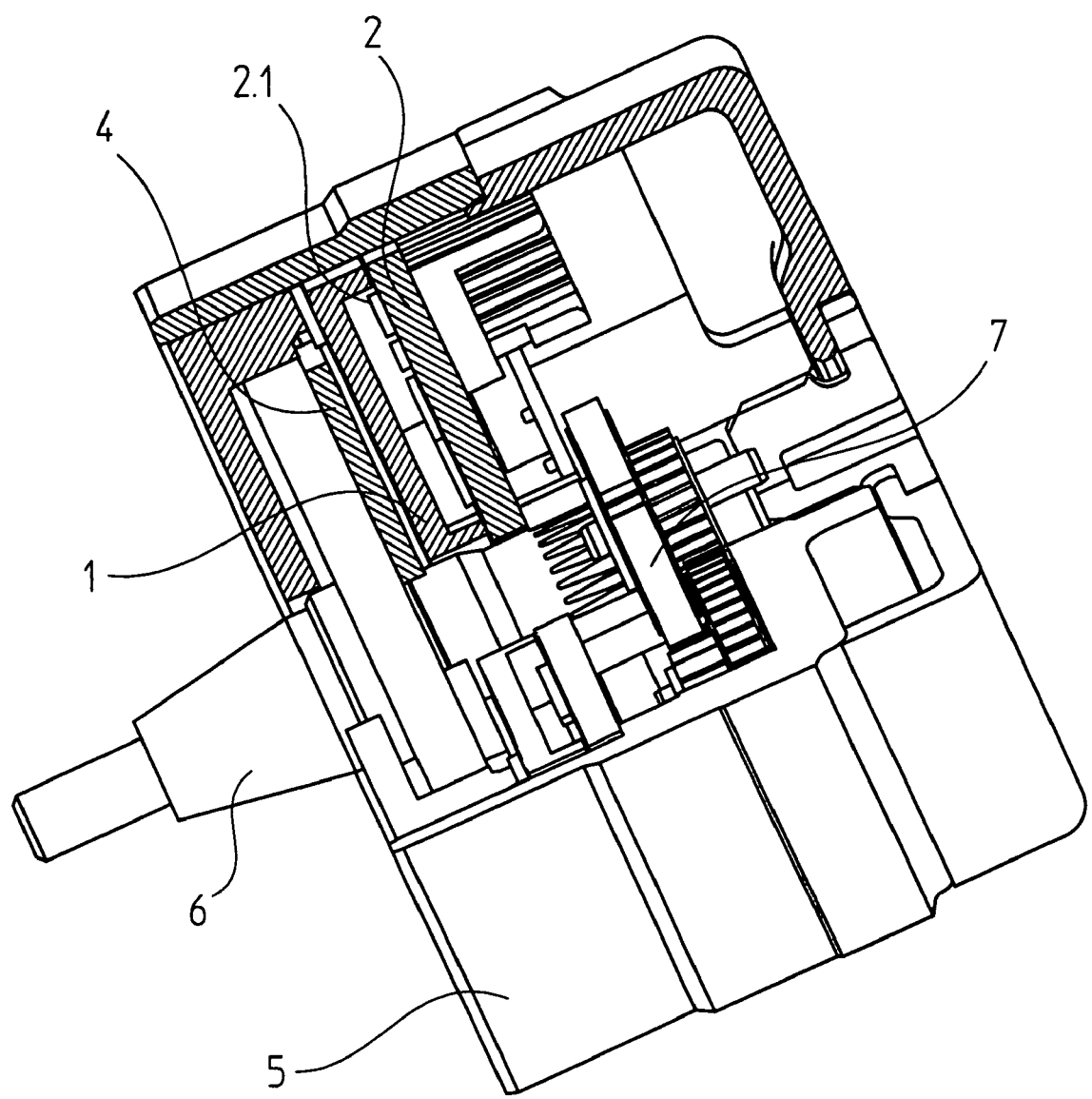
FIG. 3 is a perspective view of a rotary encoder with the housing pried open for illustration purposes.

FIG. 3 shows a rotary encoder equipped with the inductive sensor according to an example embodiment of the present invention. The rotary encoder has a stationary housing 5 and a shaft 6 that is rotatable relative to the housing. Board 4 having pitch structure 4.1 is fixed on shaft 6 in a rotatably fixed manner. In contrast, the sandwich-type compound or structure, made up of the two circuit boards 1, 2, is affixed on housing 5. Furthermore, the rotary encoder includes reduction gears 7, which may be required for a multi-turn functionality of the rotary encoder. Due to the compact design of the inductive sensor, a significantly smaller design of the rotary encoder may be possible. Furthermore, the hermetical covering of components 2.1 of the evaluation electronics may result in a very reliable and robust rotary encoder.

What is claimed is:

1. An inductive sensor, comprising:
at least two circuit boards;
receiver circuit traces and excitation coils both arranged on a first one of the circuit boards; and
components of an evaluation electronic arrangement configured to evaluate signals that originate from the receiver circuit traces arranged on a second one of the circuit boards;
wherein the circuit boards are joined in a sandwich manner, the receiver circuit traces and the second circuit board in electrical contact, the excitation coils and the second circuit board in electrical contact, at least one component of the evaluation electronic arrangement arranged between the circuit boards.

2. The inductive sensor according to claim 1, wherein the components of the evaluation electronic arranged are arranged on both sides of the second one of the circuit boards.

3. The inductive sensor according to claim 1, wherein the first one of the circuit boards and the second one of the circuit boards are joined to each other at least one of mechanically and electrically by a soldered connection.

4. The inductive sensor according to claim 1, wherein the first one of the circuit boards and the second one of the circuit boards are joined to each other by a bonded connection.

5. The inductive sensor according to claim 1, wherein the first one of the circuit boards and the second one of the circuit boards are joined to each other by a welded connection.

6. The inductive sensor according to claim 1, further comprising a filler material arranged to fill a volume between the circuit boards.

7. An inductive sensor comprising:
at least two circuit boards;
receiver circuit traces arranged on a first one of the circuit boards; and
components of an evaluation electronic arrangement configured to evaluate signals that originate from the receiver circuit traces arranged on a second one of the circuit boards;
wherein the circuit boards are joined in a sandwich manner, at least one component of the evaluation electronic arrangement arranged between the circuit boards; and
wherein the first one of the circuit boards includes a recess configured to accommodate at least one of the components of the evaluation electronic arrangement.

8. An inductive sensor comprising:
at least two circuit boards;
receiver circuit traces arranged on a first one of the circuit boards; and
components of an evaluation electronic arrangement configured to evaluate signals that originate from the receiver circuit traces arranged on a second one of the circuit boards;
wherein the circuit boards are joined in a sandwich manner, at least one component of the evaluation electronic arrangement arranged between the circuit boards; and
wherein at least one of the circuit boards includes an at least partially circumferential ridge arranged to at least partially cover a gap between the circuit boards joined in the sandwich manner.

9. The inductive sensor according to claim 8, wherein the ridge is arranged on a cylindrical shell side of the at least one of the circuit boards.

10. An inductive sensor, comprising:
at least two circuit boards a first one of the circuit boards including a recess;
receiver traces arranged on the first one of the circuit boards; and
components of an evaluation electronic arrangement configured to evaluate signals that originate from the receiver circuit traces arranged on a second one of the circuit boards;
wherein the circuit boards are joined in a sandwich manner, at least one component of the evaluation electronic arrangement arranged in the recess of the first one of the circuit boards and between the first one of the circuit boards and the second one of the circuit boards, the circuit boards connected to each other at least one of electrically and mechanically by a solder connection.

11. The inductive sensor according to claim 10, further comprising at least one excitation coil arranged on the first circuit board.

12. A rotary encoder, comprising:
an inductive sensor, including:
at least two circuit boards;
receiver circuit traces and excitation coils both arranged on a first one of the circuit boards; and
components of an evaluation electronic arrangement configured to evaluate signals that originate from the receiver circuit traces arranged on a second one of the circuit boards;
wherein the circuit boards are joined in a sandwich manner, the receiver circuit traces and the second circuit board in electrical contact, the excitation coils and the second circuit board in electrical contact, at least one component of the evaluation electronic arrangement arranged between the circuit boards.

* * * * *